(12) United States Patent
Kizuki et al.

(10) Patent No.: US 7,307,490 B2
(45) Date of Patent: Dec. 11, 2007

(54) HIGH FREQUENCY SWITCH DEVICE

(75) Inventors: Hirotaka Kizuki, Tokyo (JP); Noriyuki Tanino, Tokyo (JP); Junichi Somei, Nara (JP)

(73) Assignees: Mitsubishi Denki Kabushiki Kaisha, Tokyo (JP); Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/957,651

(22) Filed: Oct. 5, 2004

(65) Prior Publication Data

US 2005/0077978 A1    Apr. 14, 2005

(30) Foreign Application Priority Data

Oct. 9, 2003   (JP)   ............... 2003-350763

(51) Int. Cl.
  *H01P 1/10*   (2006.01)
  *H01P 1/15*   (2006.01)
(52) U.S. Cl. .................. 333/101; 333/103
(58) Field of Classification Search ........ 333/101, 333/103, 262
  See application file for complete search history.

(56) References Cited

U.S. PATENT DOCUMENTS 3,808,566 A * 4/1974 Thompson et al. ......... 335/152
4,897,563 A * 1/1990 Bahl ......................... 326/13
5,068,615 A * 11/1991 Strid et al. .................. 324/613
5,990,580 A    11/1999 Weigand
6,094,088 A    7/2000 Yano
6,288,672 B1   9/2001 Asano et al.
6,661,308 B2 * 12/2003 Malcolm ..................... 333/101

FOREIGN PATENT DOCUMENTS

| JP | 5-315922   | 11/1993 |
| JP | 10-215162  | 8/1998  |
| JP | 10-242826  | 9/1998  |
| JP | 2000-261218 | 9/2000 |
| JP | 2002-33602 | 1/2002  |

OTHER PUBLICATIONS

Hittite Microwave Corporation catalogue, HMC276QS24, "GaAs MMIC 4×2 Switch Matrix, 0.7-3.0 GHz".

* cited by examiner

*Primary Examiner*—Dean Takaoka
(74) *Attorney, Agent, or Firm*—Leydig, Voit & Mayer, Ltd.

(57) ABSTRACT

A high frequency switch device has SPDT(A), SPDT(B), and SPDT(C) switches, each having one pole and a first port and a second port, wherein the second port of the SPDT(A) is grounded via a terminating resistor and the second port of the SPDT(B) is grounded via a terminating resistor, respectively, and the first port of the SPDT(A) and the first port of the SPDT(B) are respectively connected to the first port and the second port of the SPDT(C).

6 Claims, 7 Drawing Sheets

| ON path | SPDT1 | SPDT2 | SPDT3 | SPDT4 | SPDT5 |
|---|---|---|---|---|---|
| In1-Out | 1 | 0 | 1 | 0 | 1 |
| In2-Out | 0 | 1 | 0 | 0 | 1 |
| In3-Out | 0 | 0 | 1 | 1 | 0 |
|  | 0 | 0 | 0 | 1 | 0 |

| ON path | SPDT1 | SPDT2 | SPDT3 | SPDT6 | SPDT7 | SPDT8 | SPDT9 |
|---|---|---|---|---|---|---|---|
| In1-Out | 1 | 0 | 1 | 0 | 0 | 0/1 | 1 |
| In2-Out | 0 | 1 | 0 | 0 | 0 | 0/1 | 1 |
| In3-Out | 0 | 0 | 0/1 | 1 | 0 | 1 | 0 |
| In4-Out | 0 | 0 | 0/1 | 0 | 1 | 0 | 0 |

HIGH FREQUENCY SWITCH DEVICE

BACKGROUND OF THE INVENTION

1. Field of the Invention

The present invention relates to a high frequency switch device, and particularly to a high frequency switch device employed in a wireless communication apparatus, a satellite communication apparatus and a satellite broadcasting apparatus.

2. Description of the related Art

With a sudden proliferation of wireless communication apparatuses such as a cellular phone, a wireless LAN, etc. and more functionality or the like of information devices and systems due to a multichannel configuration of satellite broadcasting, there has recently been a sharp increase in demand for a high frequency switch employed in RF transmit-receive units of these devices and systems.

The high frequency switch is used for switching between transmission and reception and switching between call modes in the case of a cellular phone and used for selection of signals from satellites of plural models in the case of a satellite dish. The high frequency switch is ranked an indispensable electronic device which supports an information and communication society.

The high frequency switch needs to have characteristics that (1) power consumption thereof is low, (2) its insertion loss is small and a leak of input power to other paths is low at its OFF, i.e., high isolation is enabled and high performance can be realized, (3) multifunctioning and a size reduction thereof are easy, (4) its low cost is realized, for example. As a high frequency switch that meets these, a high frequency switch configured of a microwave integrated circuit (MMIC) with GaAs FETs as bases is being put to use with growing frequency.

A GaAs MMIC switch using these FETs has been widely used for switching between signal paths and selection of a specific signal in a high frequency device used in a band of approximately 0.8 to 10 GHz. A high frequency switch used in conjunction with multifunctioning of a high frequency device and an increase in capacity for transmitted/received information and its diversification or the like has also been moved toward high functioning as in the case of the conventional SPDT (single pole double throw, 1×2) to SP3T (single pole 3 throw, 1×3) and SP4T (single pole 4 throw, 1×4) and to a matrix switch such as a 4×2 switch (4×2 Switch Matrix).

As a well-known example of the conventional high frequency switch, there is known a 4×2SW using FETs, for example. The 4×2SW is configured by integrating eight switch elements on a GaAs substrate.

In order to allow one switch element to include four FETs, 32 FETs are used in total. Since two-systematic lines for control signals are respectively needed to ON/OFF control the respective switch elements, sixteen-systematic lines for control signals are used over the whole high frequency switch.

In general, an N×M switch (N×M Switch Matrix) needs (2×N×M) control terminals, and hence the number of terminals materially increases with high functioning of a high frequency switch. In the present 4×2 switch, a decoder IC as well as a switch circuit is also brought into integration to suppress an increase in the number of the terminals and perform switching between signals on the 16-systematic control signal lines (see, for example, Hittite v04.0701: Catalog of HMC276QS24 produced by Hittite Microwave Corporation).

As another well-known example of other high frequency switch, there has been proposed a configuration wherein a switch circuit using distributed constant type FETs is used in each SPDT, so that a less reduced passage loss can be obtained upon switch ON and high isolation can be expected upon switch OFF (see, for example, Japanese Patent Laid-Open No. 2002-33602, the paragraph numbers [0013] and [0014] and FIG. 1).

As yet another well-known example of other high frequency switch, there has been disclosed a high frequency switch which includes a plurality of tristate switches, which are connected in tournament form by strip lines and wherein the lengths of the strip lines from branch points of the lines connected to the respective switches to their corresponding switches are adjusted in such a manner that the real part of impedance at the time that the switches each held in an off state are seen from the branch points, reaches the maximum and the imaginary part thereof is brought to 0, and the lengths from the basic branch points of the lines connected to the respective branch points to the respective corresponding branch points are respectively adjusted to an integral multiple of a ½ wavelength (see, for example, Japanese Patent Laid-Open No. 2000-261218, the paragraph number [0006] and FIG. 1).

As a still further well-known example of other high frequency switch, there has been disclosed one in which when four or more receiving antennas are switched in a holographic radar, a single pole double throw (SPDT) output type or single pole 3 throw (SP3T) output type unit switch, e.g., a plane circuit type high frequency switch such as MMIC, HIC or the like is used, and such unit switches are utilized in combination in tournament form for the purpose of realization of multiswitching (see, for example, Japanese Patent Laid-Open No. 2000-155171, the paragraph number [0005] and FIG. 5).

The conventional high frequency switch must be provided with a control decoder IC circuit aside from a switch unit to reduce the control terminals in number. Thus, a chip area increased and a reduction in cost could not be achieved sufficiently. Since a logic circuit of a decoder IC unit is fine and complex as compared with the switch unit, process yields are reduced and hence a reduction in cost could not be achieved sufficiently due to the reduction in the yield.

On the other hand, when no decoder circuit is brought into integration, the N×M switch needs (2×N×M) control terminals and needs to control (2×N×M) lines for control signals independently. It is thus necessary to provide (2×N×M) control pins. Therefore, the N×M switch resulted in upsizing of a chip and a package and an increase in cost.

Further, when a plurality of switch elements are connected in tournament form to reduce the number of the control pins, the setting of impedance of each connecting wiring becomes complex to realize high isolation of the high frequency switch, so an increase in complexity of a circuit configuration cannot be avoided. Such a high frequency circuit that a circuit configuration on a chip is greatly affected by its electric characteristic, unavoidably resulted in a reduction in the degree of freedom of circuit design.

As described above, the conventional high frequency switch is accompanied by the problems that when the decoder circuit is added thereto, its size reduction and low cost cannot be achieved, whereas when no decoder circuit is added, the number of the control pins increases, thus resulting in upsizing of the chip and package and the increase in cost, and when an attempt is made to reduce the number of the control pins and achieve high isolation, the setting of impedance in the circuit becomes complex and the degree of freedom of design is degraded, for example.

SUMMARY OF THE INVENTION

The present invention has been made to solve the foregoing problems. A first object of the present invention is to provide a small-sized high frequency switch device which improves an isolation characteristic in a simple circuit configuration.

According to one aspect of the present invention, there is provided a high frequency switch device comprising: first and second SPDT switches each having one pole, and a first port and a second port at one ends of paths branching off into two from the pole, the second ports being respectively grounded via terminating resistors each having predetermined impedance; and a third SPDT switch having one pole, a first port and a second port at one ends of paths branching off into two from the pole, the first port and the second port of the third SPDT switch individually connected to the first ports of the first and second SPDT switches.

Accordingly, in the high frequency switch device according to the present invention, the number of control pins is reduced to enable its size reduction. An isolation characteristic is enhanced owing to such a simple configuration that second ports of SPDTs are connected to their corresponding terminating resistors, and a reflection variation in input signal, i.e., variations in the intensity and phase of the input signal can be lessened owing to the effects of the terminating resistors upon input changeover to first and second SPDT switches, thereby making it possible to suppress adverse effects exerted on other circuits.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

First Embodiment

Figure 1:
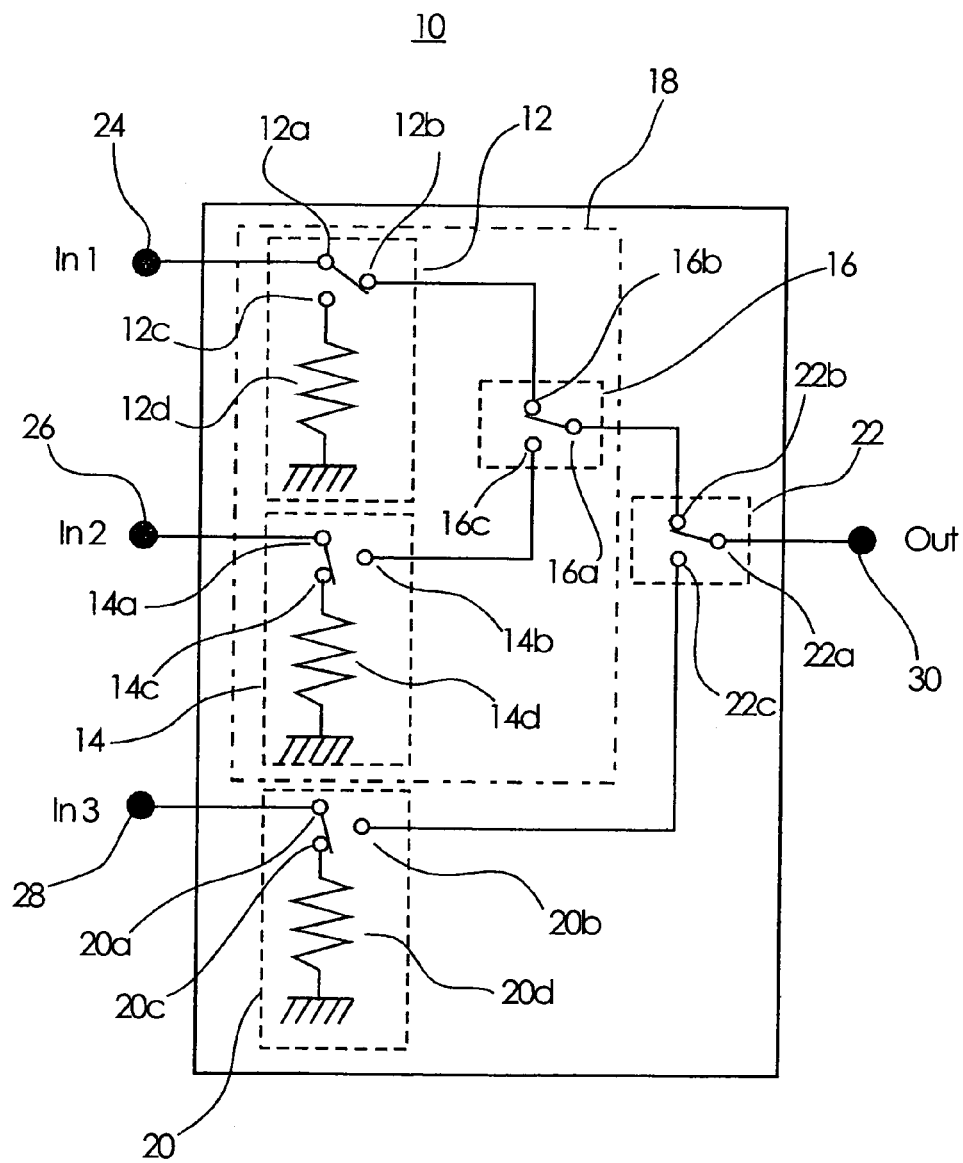
FIG. 1 is a block diagram showing a high frequency switch according to one embodiment of the present invention.

FIG. 1 is a block diagram showing a high frequency switch according to one embodiment of the present invention.

FIG. 1 describes an SP3T (1×3) type high frequency switch as one example.

In FIG. 1, the SP3T type high frequency switch 10 comprises an SPDT type high frequency switch 18 comprising an SPDT(A) 12 used as a first SPDT switch, an SPDT(B) 14 used as a second SPDT switch, and an SPDT (C) 16 used as a third SPDT switch, an SPDT(D) 20 used as a fourth SPDT switch and an SPDT(E) 22 used as a fifth SPDT switch in addition to the high frequency switch 18.

The SPDT(A) 12 has one pole 12a corresponding to a branch point, a first port 12b used as a first port and a second port 12c used as a second port both associated with one ends of paths branching off into two from the pole 12a. The pole 12a is connected to a first input terminal 24, and the second port 12c is grounded via a terminating resistor 12d.

The SPDT(B) 14 also has a first port 14b and a second port 14c which two-branch off from a pole 14a. The pole 14a is connected to a second input terminal 26, and the second port 14c is grounded via a terminating resistor 14d.

The SPDT(C) 16 also has a first port 16b and a second port 16c which two-branch off from a pole 16a. The first port 16b of the SPDT(C) 16 is connected to the first port 12b of the SPDT(A) 12, and the second port 16c of the SPDT(C) 16 is connected to the first port 14b of the SPDT(B) 14.

When the pole 16a of the SPDT(C) 16 is connected to its corresponding output terminal in the switch constituted of the SPDT(A) 12, SPDT(B) 14 and SPDT(C) 16, such a switch can be considered to be the SPDT type high frequency switch 18.

The SPDT(D) 20 has a first port 20b and a second port 20c which branch off into two from a pole 20a. The pole 20a is connected to a third input terminal 28, and the second port 20c is grounded via a terminating resistor 20d.

The SPDT(E) 22 also has a first port 22b and a second port 22c which two-branch off from a pole 22a. The first port 22b of the SPDT(E) 22 is connected to the pole 16a of the SPDT(C) 16 in the high frequency switch 18, and the second port 22c of the SPDT(E) 22 is connected to the first port 20b of the SPDT(D) 20. The pole 22a of the SPDT(E) 22 is connected to an output terminal 30.

The terminating resistors 12d, 14d and 20d used in the high frequency switch 10 respectively have resistance values corresponding to values determined depending on the characteristic impedance of the high frequency switch 10 per se and the characteristic impedance of a circuit connected with the high frequency switch 10. Although their resistance values are normally 50 Ω respectively, they can be optimized in a range of approximately 25 to 150 Ω according to circumstances.

In FIG. 1, In1 indicates an input signal 1, In2 indicates an input signal 2, In3 indicates an input signal 3, and Out indicates an output signal, respectively. A state shown in FIG. 1 indicates a state in which In1 is being outputted.

Figure 2:
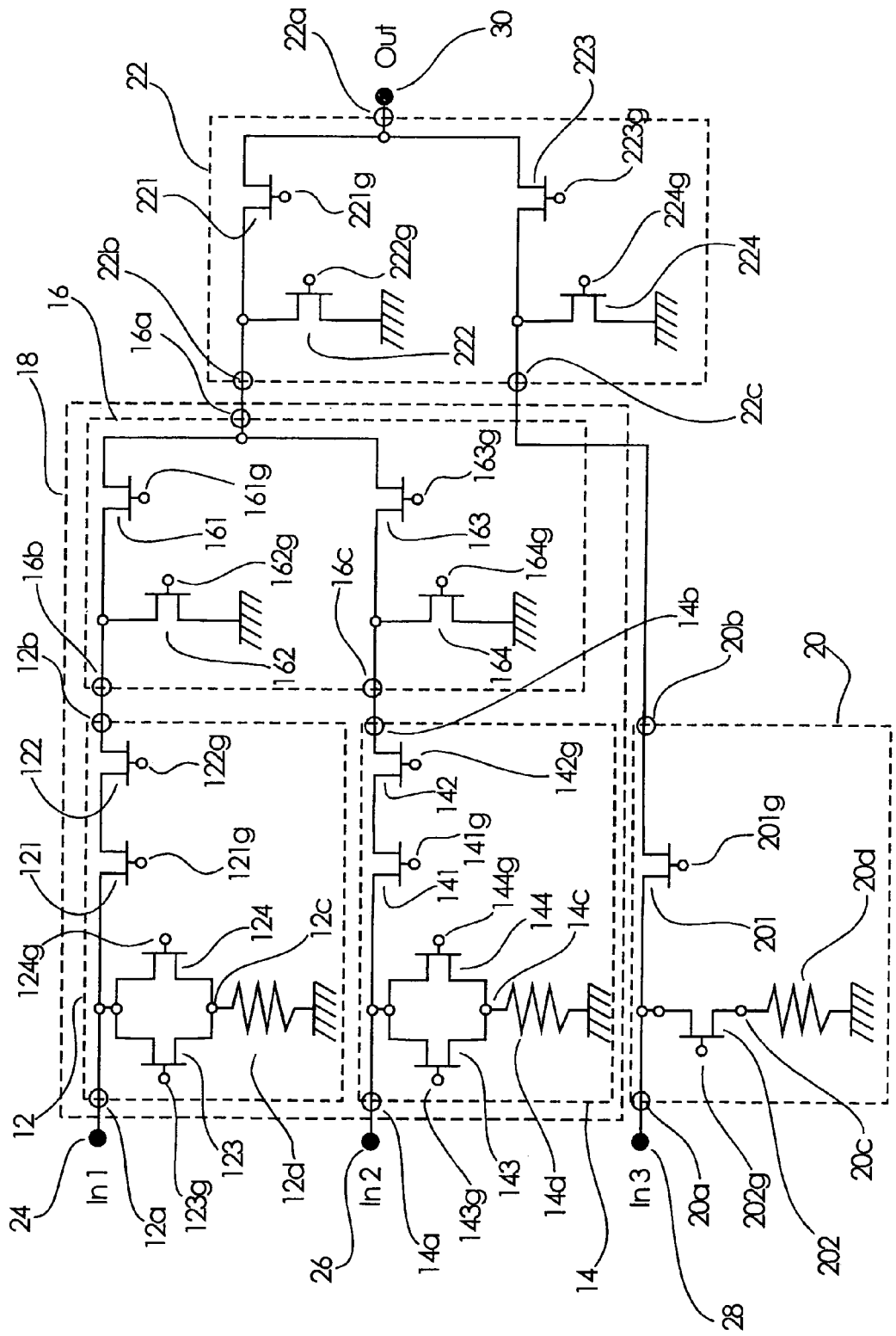
FIG. 2 is a circuit diagram of the high frequency switch according to one embodiment of the present invention.

FIG. 2 is a circuit diagram of the high frequency switch according to one embodiment of the present invention. In the figure, the same reference numerals as those shown in FIG. 1 are the same or equivalent ones. The reference numerals are similar even in the drawings shown below.

In the SPDT(A) 12 in FIG. 2, a first FET 121 used as a first field effect transistor and a second FET 122 used as a second field effect transistor are connected in series with each other via a source thereof and a drain thereof. One end of the second FET 122, which is placed on the side free of a connecting point of the first FET 121 and the second FET 122, is configured as a first port 12b. One end of the first FET 121, which is placed on the side free of a connecting point of the first FET 121 and the second FET 122, is connected to a first input terminal 24 as a pole 12a. A third FET 123 used as a third field effect transistor and a fourth FET 124 used as a fourth field effect transistor are connected in parallel to each other via their sources and drains. One connecting point is connected in shunt with the pole 12a, whereas the other connecting point is grounded as a second port 12c via a terminating resistor 12d.

Control signals for controlling the high frequency switch 10 are respectively applied to a gate electrode 121g of the first FET 121, a gate electrode 122g of the second FET 122, a gate electrode 123g of the third FET 123 and a gate electrode 124g of the fourth FET 124.

In the SPDT(B) 14, a first FET 141 used as a first field effect transistor and a second FET 142 used as a second field effect transistor are connected in series with each other via a source thereof and a drain thereof. One end of the second FET 142, which is placed on the side free of a connecting point of the first FET 141 and the second FET 142, is configured as a first port 14b. One end of the first FET 141, which is placed on the side free of a connecting point of the first FET 141 and the second FET 142, is connected to a second input terminal 26 as a pole 14a. A third FET 143 used as a third field effect transistor and a fourth FET 144 used as a fourth field effect transistor are connected in parallel to each other via their sources and drains. One connecting point is connected in shunt with the pole 14a, whereas the other connecting point is grounded as a second port 14c via a terminating resistor 14d.

Control signals for controlling the high frequency switch 10 are respectively applied to a gate electrode 141g of the first FET 141, a gate electrode 142g of the second FET 142, a gate electrode 143g of the third FET 143 and a gate electrode 144g of the fourth FET 144.

In the SPDT(C) 16, one end of the source or drain of a fifth FET 161 used as a fifth field effect transistor is connected to the first port 12b of the SPDT(A) 12 as a first port 16b. A sixth FET 162 used as a sixth field effect transistor is shunt-connected between the first port 16b of the fifth FET 161 and ground via its source and drain. One end of the source or drain of a seventh FET 163 used as a seventh field effect transistor is connected to the first port 14b of the SPDT(B) 14 as a second port 16c. An eighth FET 164 used as an eighth field effect transistor is shunt-connected between the second port 16c of the seventh FET 163 and ground via its source and drain. The other end of the fifth FET 161, which is placed on the side non-connected as the first port 16b, and the other end of the seventh FET 163, which is placed on the side non-connected as the second port 16c, are connected to each other to configure a pole 16a.

Control signals for controlling the high frequency switch 10 are respectively applied to a gate electrode 161g of the fifth FET 161, a gate electrode 162g of the sixth FET 162, a gate electrode 163g of the seventh FET 163 and a gate electrode 164g of the eighth FET 164.

In the SPDT(D) 20, one end of the source or drain of a ninth FET 201 used as a ninth field effect transistor is connected to a third input terminal 28 as a pole 20a, and the other end thereof is configured as a first port 20b. One end of a tenth FET 202 used as a tenth field effect transistor is shunt-connected via its source and drain to the pole 20a side of the ninth FET 201. The other end of the tenth FET 202 is configured as a second port 20c, and the second port 20c and the ground are connected to each other via a terminating resistor 20d.

Control signals for controlling the high frequency switch 10 are respectively applied to a gate electrode 201g of the ninth FET 201 and a gate electrode 202g of the tenth FET 202.

In the SPDT(E) 22, one end of the source or drain of a fifth FET 221 used as a fifth field effect transistor is connected to the pole 16a of the SPDT(C) 16 as a first port 22b. A sixth FET 222 used as a sixth field effect transistor is shunt-connected between the first port 22b of the fifth FET 221 and ground via its source and drain. One end of the source or drain of a seventh FET 223 used as a seventh field effect transistor is connected to the first port 20b of the SPDT(D) 20 as a second port 22c. An eighth FET 224 used as an eighth field effect transistor is shunt-connected between the second port 22c of the seventh FET 223 and ground via its source and drain. The other end of the fifth FET 221, which is placed on the side non-connected to the first port 22b, and the other end of the seventh FET 223, which is placed on the side non-connected to the second port 22c, are connected to each other and connected to an output terminal 30 as a pole 22a.

Control signals for controlling the high frequency switch 10 are respectively applied to a gate electrode 221g of the fifth FET 221, a gate electrode 222g of the sixth FET 222, a gate electrode 223g of the seventh FET 223 and a gate electrode 224g of the eighth FET 224.

The electric circuit shown in FIG. 2 can be realized by forming a GaAsMMIC in which a GaAsFET, MIM capacitors, wirings, resistors, wiring pads, etc. are integrated over a GaAs substrate, using the known manufacturing method. It can be fabricated on other semiconductor substrate of InP, Si, SiGe or the like in addition to GaAs. Configuring the high frequency switch by the MMIC in this way makes it possible to provide a high frequency switch device small in size and low in cost.

The operation of the high frequency switch 10 will next be explained.

Assuming that in FIG. 1, a logic value used to connect the pole 12a and first port 12b of the SPDT(A) 12 is "1", a logic value used to connect the pole 12a and the second port 12c is "0", a logic value used to connect the pole 14a and first port 14b of the SPDT(B) 14 is "1", a logic value used to connect the pole 14a and the second port 14c is "0", a logic value used to connect the pole 16a and first port 16b of the SPDT(C) 16 is "1", a logic value used to connect the pole 16a and the second port 16c is "0", a logic value used to connect the pole 20a and first port 20b of the SPDT(D) 20 is "1", a logic value used to connect the pole 20a and the second port 20c is "0", a logic value used to connect the pole 22a and first port 22b of the SPDT(E) 22 is "1", and a logic value used to connect the pole 22a and the second port 22c is "0", the operation of the high frequency switch 10 can be represented in an operation logic table (truth table).

Figures 3, 4:
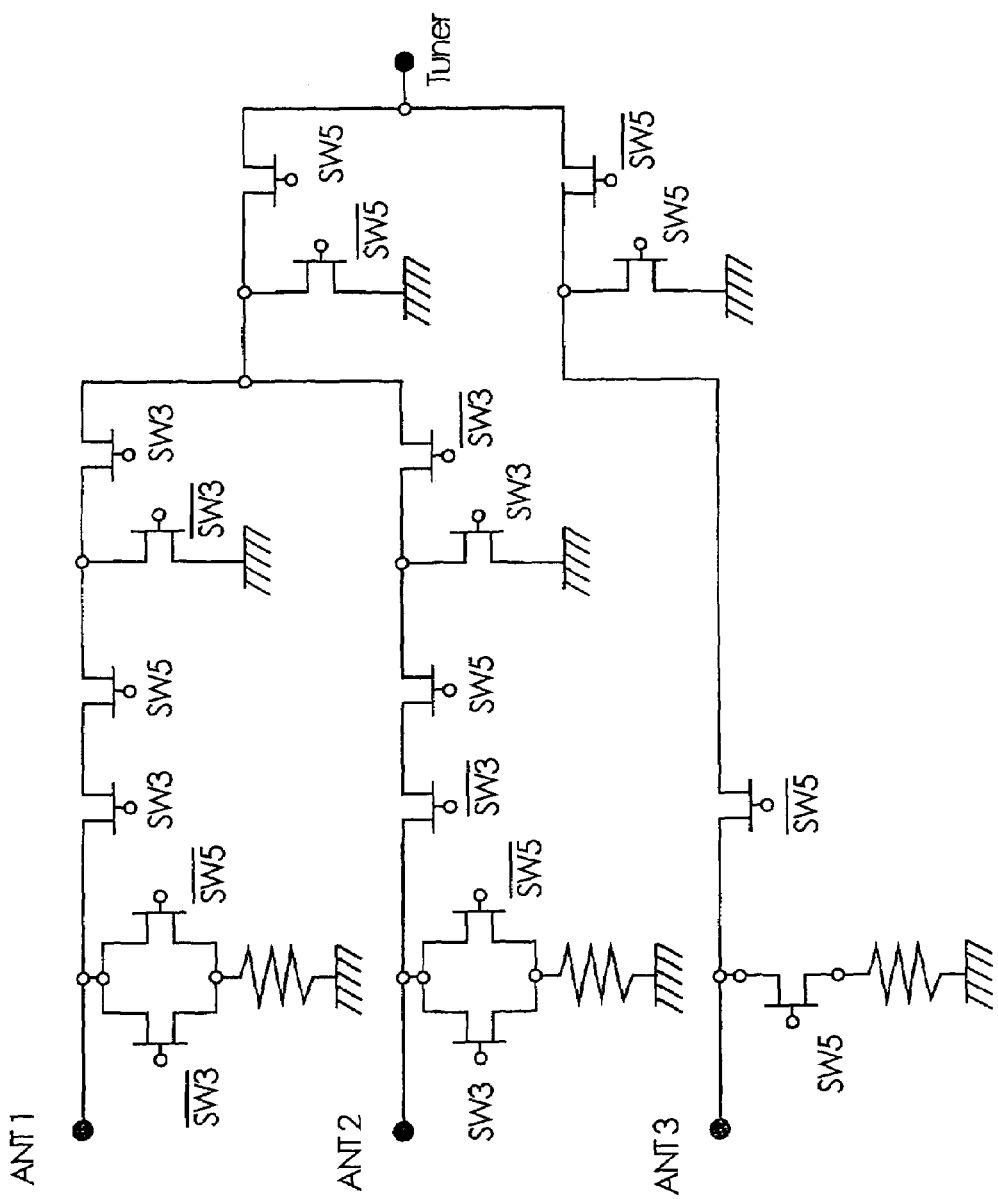
FIG. 3 is a logic diagram showing operation logic of the high frequency switch according to one embodiment of the present invention.
FIG. 4 is a circuit diagram showing one example of a control operation of the high frequency switch according to one embodiment of the present invention.

FIG. 3 is a logic diagram showing operation logic of the high frequency switch according to one embodiment of the present invention.

If an ON path for outputting In1 as Out is In1-Out in FIG. 3, then this path is configured where the SPDT(A) 12 selects the logic value "1", the SPDT(B) 14 selects the logic value "0", the SPDT(C) 16 selects the logic value "1", the SPDT (D) 20 selects the logic value "0", and the SPDT(E) 22 selects the logic value "1" respectively.

Similarly, an In2-Out path is configured where the SPDT (A) 12 selects the logic value "0", the SPDT(B) 14 selects the logic value "1", the SPDT(C) 16 selects the logic value "0", the SPDT(D) 20 selects the logic value "0", and the SPDT(E) 22 selects the logic value "1", respectively.

Similarly, an In3-Out path is configured where the SPDT (A) 12 selects the logic value "0", the SPDT(B) 14 selects the logic value "0", the SPDT(C) 16 selects the logic value "1", the SPDT(D) 20 selects the logic value "1", and the SPDT(E) 22 selects the logic value "0", respectively or where the SPDT(A) 12 selects the logic value "0", the SPDT(B) 14 selects the logic value "0", the SPDT(C) 16 selects the logic value "0", the SPDT(D) 20 selects the logic value "1", and the SPDT(E) 22 selects the logic value "0", respectively.

When the logic values shown in FIG. 3 are expressed in logical expressions assuming that the logic value of the SPDT(A) 12 is SPDT1, the logic value of the SPDT(B) 14 is SPDT2, the logic value of the SPDT(C) 16 is SPDT3, the logic value of the SPDT(D) 20 is SPDT4, and the logic value of the SPDT(E) 22 is SPDT5, respectively, they can be written as follows:

SPDT1=SPDT5∩SPDT3

SPDT2=SPDT5∩$\overline{SPDT3}$

SPDT4=$\overline{SPDT5}$

As is apparent from the logical expressions, the SPDT1, SPDT2, and SPDT4 can be expressed in SPDT3, $\overline{SPDT3}$, SPDT5 and $\overline{SPDT5}$. That is, they indicate that the SPDT(A) 12, SPDT(B) 14 and SPDT(D) 20 can also be controlled by control signals for controlling the SPDT(C) 16 and the SPDT(E) 22.

In other words, it is understood that the high frequency switch 10 is configured as shown in the block diagram of FIG. 1, e.g., the circuit is configured as shown in FIG. 2 and thereafter the control signals supplied from the control terminals for controlling the two SPDTs, i.e., the SPDT(C) 16 and the SPDT(E) 22 are applied so as to meet the logical expressions, whereby the circuit of the whole high frequency switch 10 can be controlled.

FIG. 4 is a circuit diagram showing one example of a control operation of the high frequency switch according to one embodiment of the present invention.

Referring to FIG. 4, the first input terminal 24 of the circuit of the high frequency switch 10 shown in FIG. 2 is connected to a first antenna (ANT1), a second input terminal 26 thereof is connected to a second antenna (ANT2), and a third input terminal 28 thereof is connected to a third antenna (ANT3) respectively, and the output terminal 30 is connected to a tuner (Tuner).

Control signals of SW3, $\overline{SW3}$, SW5 and $\overline{SW5}$ are suitably respectively applied to the gate electrodes 121g, 122g, 123g, 124g, 141g, 142g, 143g, 144g, 161g, 162g, 163g, 164g, 201g, 202g, 221g, 222g, 223g and 224g. The $\overline{SW3}$ and $\overline{SW5}$ respectively show the inverse signals of the SW3 and SW5. That is, when the SW3 and SW5 are ON signals respectively, the $\overline{SW3}$ and $\overline{SW5}$ are OFF signals respectively. In the high frequency switch 10 shown in FIG. 2, 0V is applied as the ON signals, and −5V is applied as the OFF signals.

As is apparent from FIG. 4, the switching of the SP3T type high frequency switch 10 is realized by the four signals of the SW3, $\overline{SW3}$, SW5 and $\overline{SW5}$. That is, owing to the configuration of the circuit in accordance with the block diagram shown in FIG. 1, the operation of the SP3T type high frequency switch that has heretofore needed the six control signals can be reduced up to four without integrating a decoder circuit, thereby making it possible to simplify a drive circuit.

Further, the second ports 12c, 14c and 20c of the SPDT (A) 12, SPDT(B) 14 and SPDT(D) 20 are respectively grounded via the terminating resistors 12d, 14d and 20d. Owing to such a simple configuration, isolation can be enhanced, and changes in signal amplitude and phase due to signal reflection can be lessened upon switch changeover by the effects of the terminating resistors, thereby making it possible to suppress adverse effects on the circuit due to reflection variations.

Second Embodiment

Figure 5:
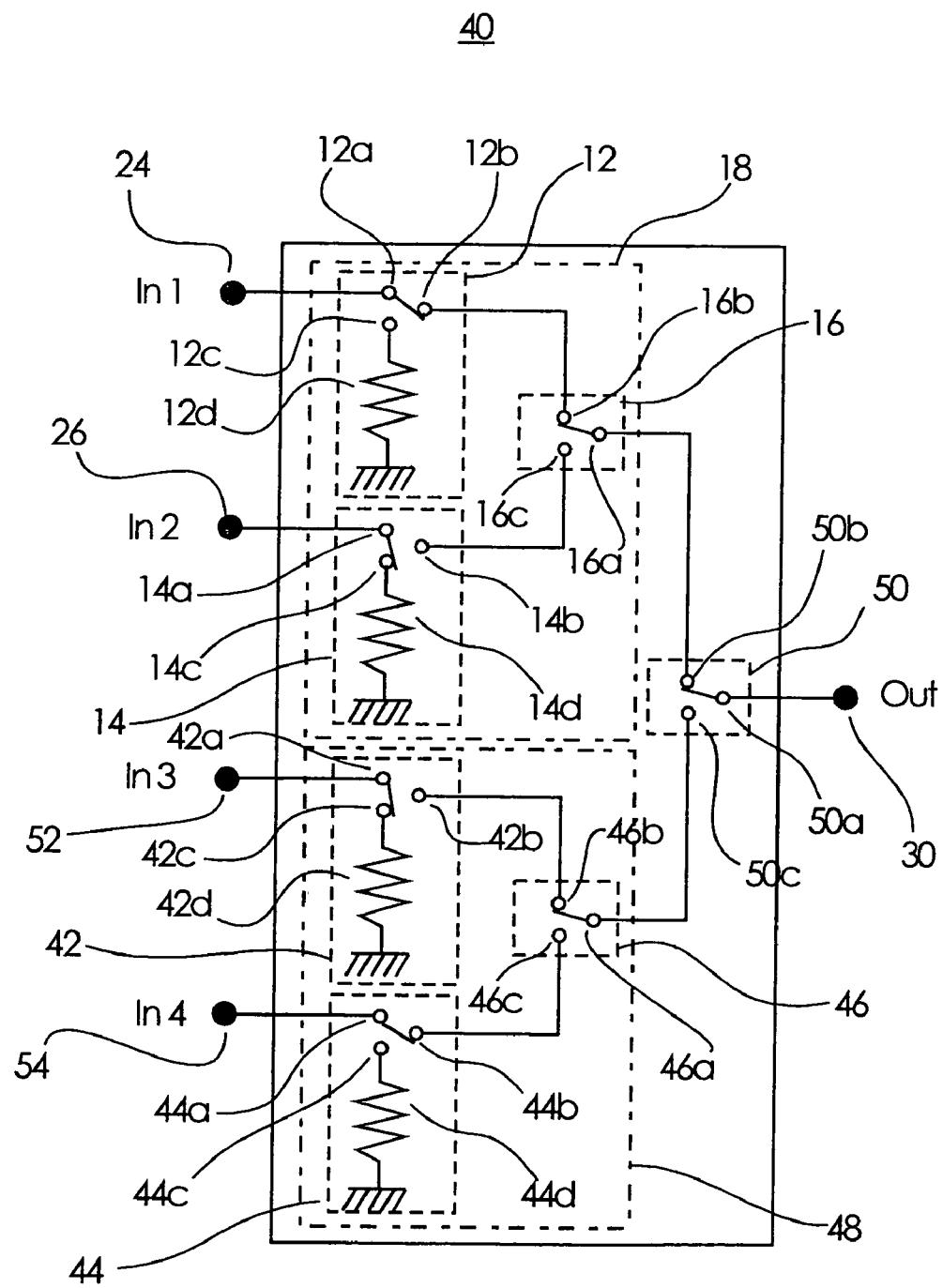
FIG. 5 is a block diagram showing a high frequency switch according to one embodiment of the present invention.

FIG. 5 is a block diagram showing a high frequency switch according to one embodiment of the present invention.

FIG. 5 describes an SP4T(1×4) type high frequency switch as one example.

In FIG. 5, the SP4T type high frequency switch 40 is further additionally provided with another SPDT type high frequency switch 48 comprising an SPDT(F) 42 used as a sixth SPDT switch, an SPDT(G) 44 used as a seventh SPDT switch and an SPDT(H) 46 used as an eighth SPDT switch in addition to an SPDT type high frequency switch 18 comprising an SPDT(A) 12 used as a first SPDT switch, an SPDT(B) 14 used as a second SPDT switch and an SPDT(C) 16 used as a third SPDT switch, and includes an SPDT(I) 50 used as a ninth SPDT switch.

The SPDT(F) 42 has a pole 42a, a first port 42b used as a first port and a second port 42c used as a second port both associated with one ends of paths branching off into two from the pole 42a. The pole 42a is connected to a third input terminal 52, and the second port 42c is grounded via a terminating resistor 42d.

The SPDT(G) 44 also has a first port 44b and a second port 44c which two-branch off from a pole 44a. The pole 44a is connected to a fourth input terminal 54, and the second port 44c is grounded via a terminating resistor 44d.

The SPDT(H) 46 also has a first port 46b and a second port 46c which two-branch off from a pole 46a. The first port 46b of the SPDT(H) 46 is connected to the first port 42b of the SPDT(F) 42, and the second port 46c of the SPDT(H) 46 is connected to the first port 44b of the SPDT(G). 44.

The SPDT(I) 50 also has a first port 50b and a second port 50c which two-branch off from a pole 50a. The first port 50b of the SPDT(I) 50 is connected to a pole 16a of the SPDT(C) 16 in the high frequency switch 18, and the second port 50c of the SPDT(I) 50 is connected to the pole 46a of the SPDT(H) 46 in the high frequency switch 48. The pole 50a of the SPDT(I) 50 is connected to an output terminal 30.

Although the terminating resistors 42d and 44d are normally 50 Ω in a manner similar to the first embodiment, they can be optimized in a range of approximately 25 to 150 Ω as the case may be.

In FIG. 5, In1 indicates an input signal 1, In2 indicates an input signal 2, In3 indicates an input signal 3, In4 indicates an input signal 4, and Out indicates an output signal, respectively. A state shown in FIG. 5 indicates a state in which In1 is being outputted.

Figure 6:
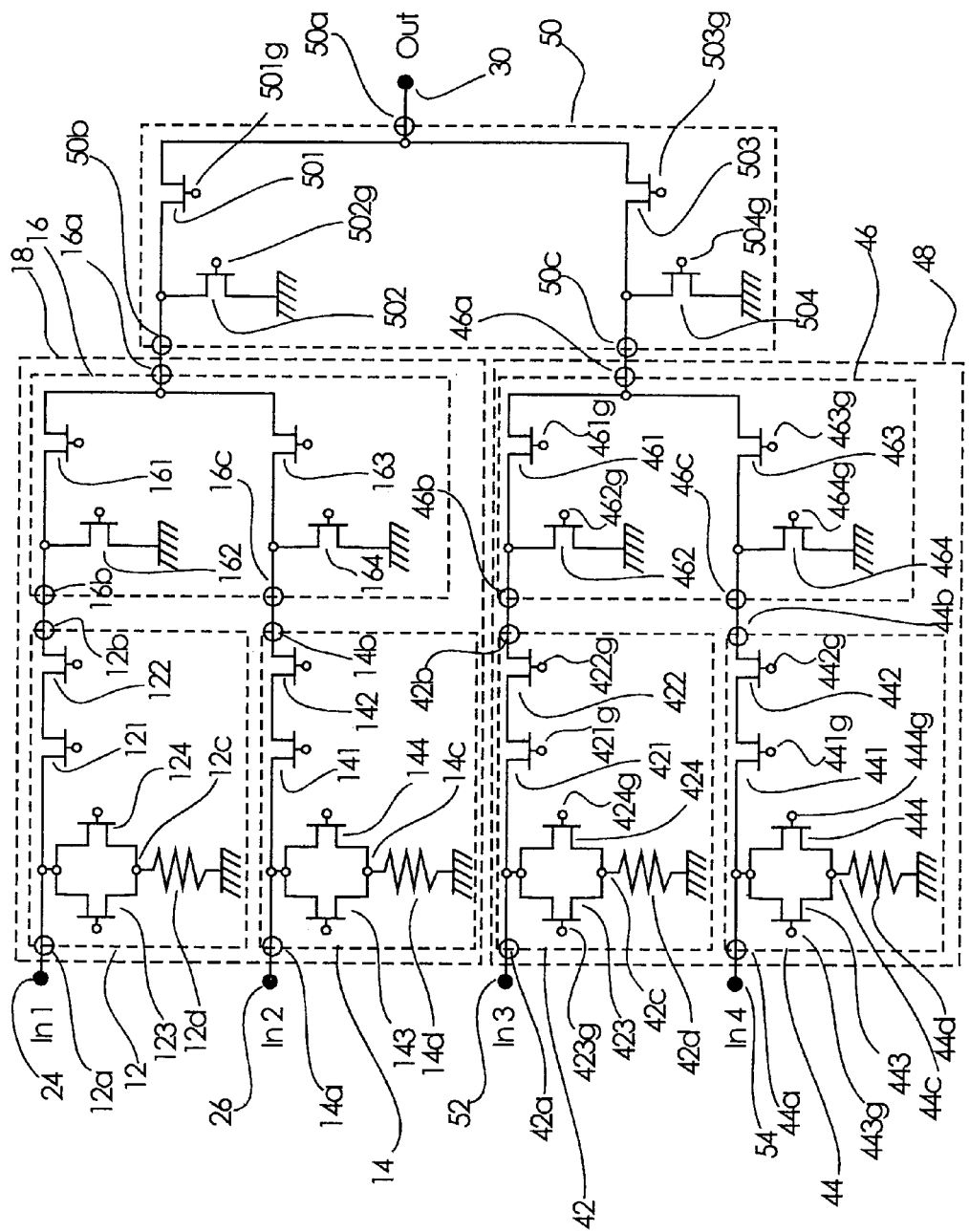
FIG. 6 is a circuit diagram of the high frequency switch according to one embodiment of the present invention.

FIG. 6 is a circuit diagram of the high frequency switch according to one embodiment of the present invention.

In FIG. 6, the SPDT(A) 12, SPDT(B) 14 and SPDT(C) 16 are identical in circuit configuration to those employed in the high frequency switch 10 according to the first embodiment.

In the SPDT(F) 42, a first FET 421 used as a first field effect transistor and a second FET 422 used as a second field effect transistor are connected in series with each other via a source thereof and a drain thereof. One end of the second FET 422, which is placed on the side free of a connecting point of the first FET 421 and the second FET 422, is configured as a first port 42b. One end of the first FET 421, which is placed on the side free of a connecting point of the first FET 421 and the second FET 422, is connected to a third input terminal 52 as a pole 42a. A third FET 423 used as a third field effect transistor and a fourth FET 424 used as a fourth field effect transistor are connected in parallel to each other via their sources and drains. One of connecting points of their sources and drains respective is connected in shunt with the pole 42a, whereas the other connecting point is grounded as a second port 42c via a terminating resistor 42d.

Control signals for controlling the high frequency switch 40 are respectively applied to a gate electrode 421g of the first FET 421, a gate electrode 422g of the second FET 422, a gate electrode 423g of the third FET 423 and a gate electrode 424g of the fourth FET 424.

In the SPDT(G) 44, a first FET 441 used as a first field effect transistor and a second FET 442 used as a second field effect transistor are connected in series with each other via a source thereof and a drain thereof. One end of the second FET 442, which is placed on the side free of a connecting point of the first FET 441 and the second FET 442, is configured as a first port 44b. One end of the first FET 441, which is placed on the side free of a connecting point of the first FET 441 and the second FET 442, is connected to a fourth input terminal 54 as a pole 44a. A third FET 443 used as a third field effect transistor and a fourth FET 444 used as a fourth field effect transistor are connected in parallel to each other via their sources and drains. One connecting point is connected in shunt with the pole 44a, whereas the other connecting point is grounded as a second port 44c via a terminating resistor 44d.

Control signals for controlling the high frequency switch 40 are respectively applied to a gate electrode 441g of the first FET 441, a gate electrode 442g of the second FET 442, a gate electrode 443g of the third FET 443 and a gate electrode 444g of the fourth FET 444.

In the SPDT(H) 46, one end of the source or drain of a fifth FET 461 used as a fifth field effect transistor is connected to the first port 42b of the SPDT(F) 42 as a first port 46b. A sixth FET 462 used as a sixth field effect transistor is shunt-connected between the first port 46b of the fifth FET 461 and ground via its source and drain. One end of the source or drain of a seventh FET 463 used as a seventh field effect transistor is connected to the second port 44b of the SPDT(G) 44 as a second port 46c. An eighth FET 464 used as an eighth field effect transistor is shunt-connected between the second port 46c of the seventh FET 463 and ground via its source and drain. The other end of the fifth FET 461, which is placed on the side non-connected to the first port 46b, and the other end of the seventh FET 463, which is placed on the side non-connected to the second port 46c, are connected to each other to configure a pole 46a.

Control signals for controlling the high frequency switch 40 are respectively applied to a gate electrode 461g of the fifth FET 461, a gate electrode 462g of the sixth FET 462, a gate electrode 463g of the seventh FET 463 and a gate electrode 464g of the eighth FET 464.

In the SPDT(I) 50, one end of the source or drain of a fifth FET 501 used as a fifth field effect transistor is connected to the pole 16a of the SPDT(C) 16 as a first port 50b. A sixth FET 502 used as a sixth field effect transistor is shunt-connected between the first port 50b of the fifth FET 501 and ground via its source and drain. One end of the source or drain of a seventh FET 503 used as a seventh field effect transistor is connected to the pole 46a of the SPDT(H) 46 as a second port 50c. An eighth FET 504 used as an eighth field effect transistor is shunt-connected between the second port 50c of the seventh FET 503 and ground via its source and drain. The other end of the fifth FET 501, which is placed on the side non-connected to the first port 50b, and the other end of the seventh FET 503, which is placed on the side non-connected to the second port 50c, are connected to each other and connected to an output terminal 30 as a pole 50a.

Control signals for controlling the high frequency switch 40 are respectively applied to a gate electrode 501g of the fifth FET 501, a gate electrode 502g of the sixth FET 502, a gate electrode 503g of the seventh FET 503 and a gate electrode 504g of the eighth FET 504.

The electric circuit shown in FIG. 6 can be realized as a GaAsMMIC by using the known manufacturing method in a manner similar to the first embodiment, thereby making it possible to provide a high frequency switch device small in size and low in cost.

The operation of the high frequency switch 40 will next be explained.

In FIG. 5, the poles of the SPDT(A) 12, SPDT(B) 14 and SPDT(C) 16 and the logic of connecting operations of the first and second ports are identical to those already described in the first embodiment. Assuming that in addition to it, a logic value used to connect the pole 42a and first port 42b of the SPDT(F) 42 is "1", a logic value used to connect the pole 42a and the second port 42c is "0", a logic value used to connect the pole 44a and first port 44b of the SPDT(G) 44 is "1", a logic value used to connect the pole 44a and the second port 44c is "0", a logic value used to connect the pole 46a and first port 46b of the SPDT(H) 46 is "1", a logic value used to connect the pole 46a and the second port 46c is "0", a logic value used to connect the pole 50a and first port 50b of the SPDT(I) 50 is "1", and a logic value used to connect the pole 50a and the second port 50c is "0", the operation of the high frequency switch 40 can be expressed in an operation logic table.

Figures 7, 8:
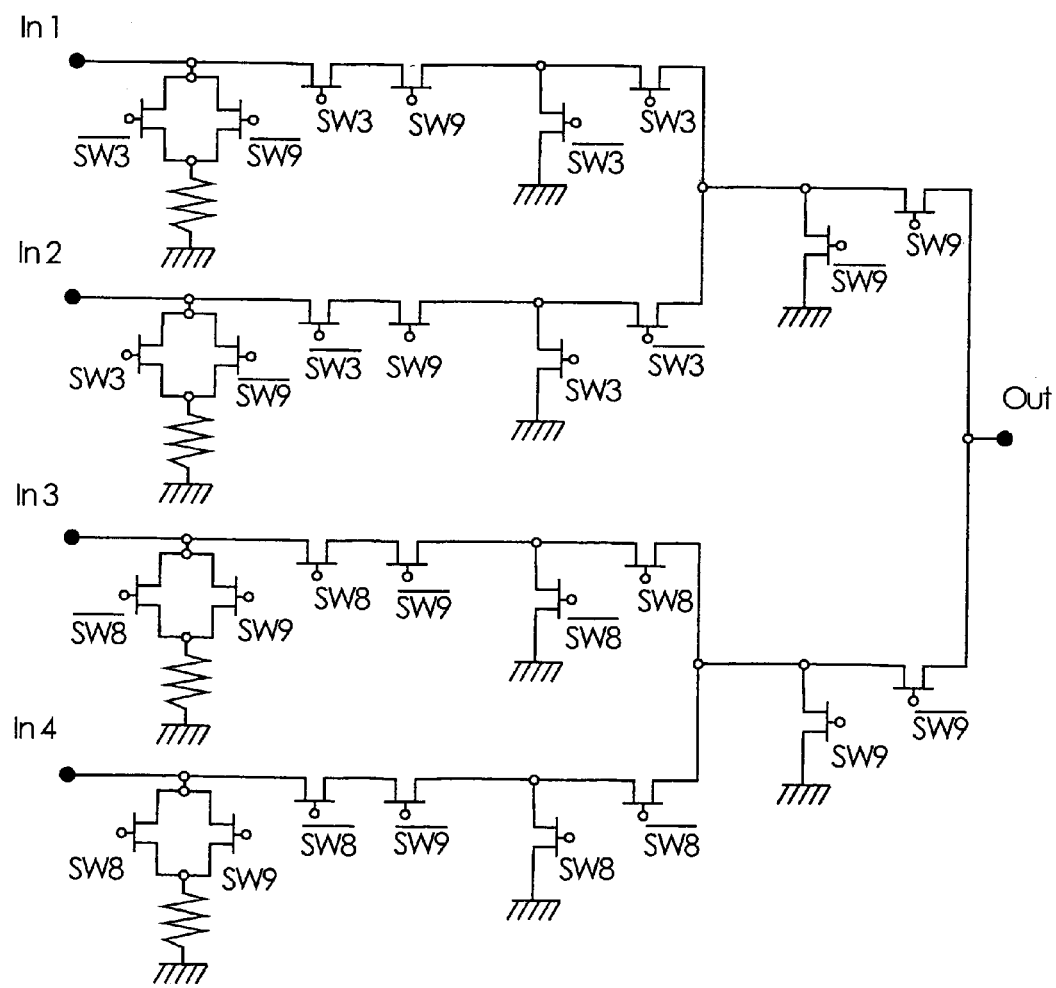
FIG. 7 is a logic diagram showing operation logic of the high frequency switch according to one embodiment of the present invention.
FIG. 8 is a circuit diagram showing one example of a control operation of the high frequency switch according to one embodiment of the present invention.

FIG. 7 is a logic diagram showing operation logic of the high frequency switch according to one embodiment of the present invention.

(I) If an ON path for outputting In1 as Out is assumed to be In1-Out, then this path is configured where the SPDT(A) 12 selects the logic value "1", the SPDT(B) 14 selects the logic value "0", the SPDT(C) 16 selects the logic value "1", the SPDT(F) 42 selects the logic value "0", the SPDT(G) 44 selects the logic value "0", the SPDT(H) 46 selects the logic value "0" or "1", and the SPDT(I) 50 selects the logic value "1" respectively.

(II) Similarly, an In2-Out path is configured where the SPDT(A) 12 selects the logic value "0", the SPDT(B) 14 selects the logic value "1", the SPDT(C) 16 selects the logic value "0", the SPDT(F) 42 selects the logic value "0", the SPDT(G) 44 selects the logic value "0", the SPDT(H) 46 selects the logic value "0" or "1", and the SPDT(I) 50 selects the logic value "1" respectively;

(III) An In3-Out path is configured where the SPDT(A) 12 selects the logic value "0", the SPDT(B) 14 selects the logic value "0", the SPDT(C) 16 selects the logic value "0" or "1", the SPDT(F) 42 selects the logic value "1", the SPDT(G) 44 selects the logic value "0", the SPDT(H) 46 selects the logic value "1", and the SPDT(I) 50 selects the logic value "0" respectively; and (IV) An In4-Out path is configured where the SPDT(A) 12 selects the logic value "0", the SPDT(B) 14 selects the logic value "0", the SPDT(C) 16 selects the logic value "0" or "1", the SPDT(F) 42 selects the logic value "0", the SPDT(G) 44 selects the logic value "1", the SPDT(H) 46 selects the logic value "0", and the SPDT(I) 50 selects the logic value "0" respectively, respectively.

When the logic values shown in FIG. 7 are expressed in logical expressions assuming that the logic value of the SPDT(A) 12 is SPDT1, the logic value of the SPDT(B) 14 is SPDT2, the logic value of the SPDT(C) 16 is SPDT3, the logic value of the SPDT(F) 42 is SPDT6, the logic value of the SPDT(G) 44 is SPDT7, the logic value of the SPDT(H) 46 is SPDT8, and the logic value of the SPDT(I) 50 is SPDT9, respectively, they can be written as follows:

$$SPDT1 = SPDT9 \cap SPDT3$$

$$SPDT2 = SPDT9 \cap \overline{SPDT3}$$

$$SPDT6 = \overline{SPDT9} \cap SPDT8$$

$$SPDT7 = \overline{SPDT9} \cap \overline{SPDT8}$$

As is apparent from the logical expressions, the SPDT1, SPDT2, SPDT6 and SPDT7 can be expressed in SPDT3, SPDT8, $\overline{SPDT8}$, SPDT9 and $\overline{SPDT9}$. That is, they indicate that the SPDT(A) 12, SPDT(B) 14, SPDT(F) 42 and SPDT (G) 44 can also be controlled by control signals for controlling the SPDT(C) 16, the SPDT(H) 46 and SPDT(I) 50.

In other words, it is understood that the high frequency switch 40 is configured as shown in the block diagram of FIG. 5, e.g., the circuit is configured as shown in FIG. 6 and thereafter the control signals supplied from the control terminals for controlling the three SPDTs, i.e., the SPDT(C) 16, the SPDT(H) 46 and SPDT(I) 50 are applied so as to meet the logical expressions, whereby the circuit of the whole high frequency switch 40 can be controlled.

FIG. 8 is a circuit diagram showing one example of a control operation of the high frequency switch according to one embodiment of the present invention.

Control signals of SW3, $\overline{SW3}$, SW8, $\overline{SW8}$, SW9 and $\overline{SW9}$ are suitably respectively applied to their corresponding gate electrodes 121g, 122g, 123g, 124g, 141g, 142g, 143g, 144g, 161g, 162g, 163g, 164g, 421g, 422g, 423g, 424g, 441g, 442g, 443g, 444g, 461g, 462g, 463g, 464g, 501g, 502g, 503g and 504g.

As is apparent from FIG. 8, the switching of the SP4T type high frequency switch 40 is realized by the six control signals of the SW3, $\overline{SW3}$, SW8, $\overline{SW8}$, SW9 and $\overline{SW9}$. That is, owing to the configuration of the circuit in accordance with the block diagram shown in FIG. 5, the operation of the SP4T type high frequency switch that has heretofore needed the eight control signals can be reduced up to six without integrating a decoder circuit, thereby making it possible to simplify a drive circuit.

In a manner similar to the first embodiment even in the case of the high frequency switch according to the present embodiment, the second ports 12c, 14c, 42c and 44c of the SPDT(A) 12, SPDT(B) 14, SPDT(F) 42 and SPDT(G) 44 are respectively grounded via the terminating resistors 12d, 14d, 42d and 44d. Owing to such a simple configuration, isolation can be enhanced, and changes in signal amplitude and phase due to signal reflection can be lessened upon switch changeover by the effects of the terminating resistors, thereby making it possible to suppress adverse effects on the circuit due to reflection variations.

Third Embodiment

Figure 9:
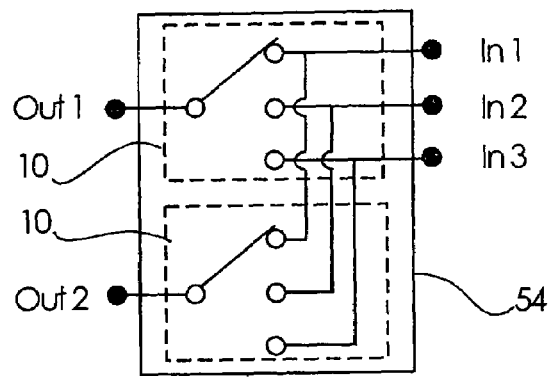
FIG. 9 is a block diagram showing a high frequency switch according to one embodiment of the present invention.

FIG. 9 is a block diagram showing a high frequency switch according to one embodiment of the present invention.

Figure 10:
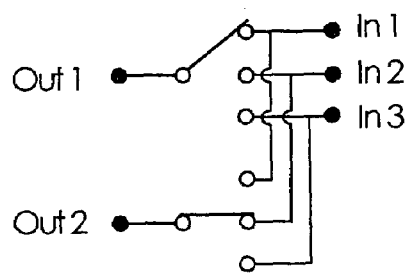
FIG. 10 is a block diagram for describing the operation of the high frequency switch according to one embodiment of the present invention.

FIG. 10 is a block diagram for describing the operation of the high frequency switch according to one embodiment of the present invention.

In FIG. 9, a 3×2 matrix switch 54 has a configuration in which the high frequency switch 10 according to the first embodiment is provided two side by side, and the first input terminals 24, the second input terminals 26 and the third input terminals 28 of the two high frequency switches 10 are respectively connected to one another. When the two high frequency switches 10 are used, the poles 12a of the SPDTs(A) 12, the poles 14a of the SPDTs(B) 14 and the poles 20a of the SPDTs(D) 20 are respectively connected to one another, and the number of input terminals is set to three and the number of output terminals is set to two.

Since the number of control terminals could be set to four without using the decoder in the high frequency switch 10 according to the first embodiment, the number of control terminals may be provided eight in the 3×2 matrix switch 54, whereas the number of control terminals needs twelve in the conventional 3×2 matrix switch free of use of the decoder. Thus, the number of terminals can be reduced as compared with the conventional product and a size reduction in the high frequency switch can be achieved.

The operation of the high frequency switch will next be explained.

The 3×2 matrix switch 54 is of a matrix type switch which selects two outputs with respect to three inputs. In FIG. 9, both Out1 and Out2 select In1. The matrix switch 54 is normally connected to a circuit whose characteristic impedance is 50 Ω. That is, the signal of In1 is divided into two, which in turn are respectively connected to the circuit whose characteristic impedance is 50 Ω.

When the state of FIG. 9 is switched to a state shown in FIG. 10, the branched one of the signal of In1 is connected to the 50 Ω circuit but another branch is brought to an open state. With this view, the signal to the Out1 is expected to greatly vary during a period in which its amplitude and phase change from the state of FIG. 9 to the state of FIG. 10.

Since, however, the 3×2 matrix switch 54 shown in FIG. 9 is configured by providing the high frequency switches 10 each described in the first embodiment side by side, the poles 12a of the SPDTs(A) 12, the poles 14a of the SPDTs (B) 14 and the poles 20a of the SPDT (D) 20 are respectively connected to one another, and the terminating resistors 12d, 14d and 20d are respectively connected to the second port 12c of the SPDT(A) 12, the second port 14c of the SPDT(B) 14 and the second port 20c of the SPDT(D) 20.

Thus, even when a specific circuit is changed from an ON state to an OFF state, the impedances from the ON state to the OFF state become equal, and the amplitude and phase of a signal on other path are controlled so as to vary small.

The 3×2 matrix switch 54 might be used in, for example, a satellite receiving converter of a DBS (Direct Broadcasting Satellite) system. In this case, three input terminals are connected to an antenna, and two output terminals are connected to a tuner.

Since the satellite receiving converter takes against image disturbance developed upon switch changeover, changes in signal amplitude and phase on the tuner side are limited to 0.5 dB or less.

Since the 3×2 matrix switch 54 has the configuration wherein the terminating resistors 12d, 14d and 20d are respectively connected to the second port 12c of the SPDT (A) 12, the second port 14c of the SPDT(B) 14 and the second port 20c of the SPDT(D) 20, it is possible to reduce image disturbance even upon switch changeover in the satellite receiving converter.

Figure 11:
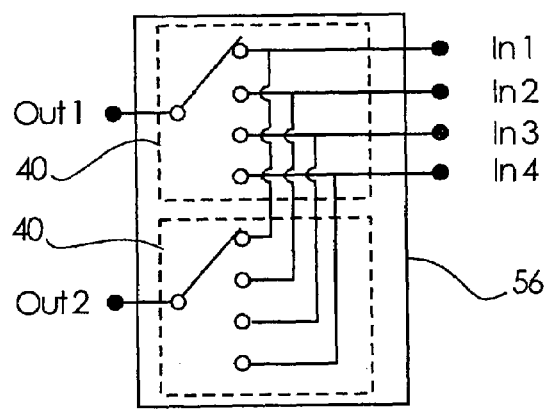
FIG. 11 is a block diagram showing a high frequency switch according to one embodiment of the present invention.

FIG. 11 is a block diagram showing a high frequency switch according to one embodiment of the present invention.

Figure 12:
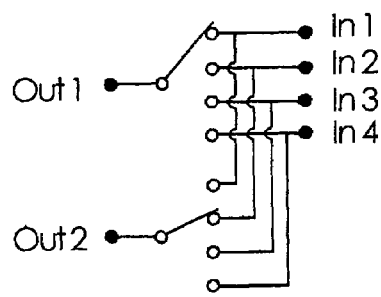
FIG. 12 is a block diagram for describing the operation of the high frequency switch according to one embodiment of the present invention.

FIG. 12 is a block diagram for describing the operation of the high frequency switch according to one embodiment of the present invention.

A 4×2 matrix switch 56 shown in FIG. 11 has a configuration wherein the high frequency switch 40 according to the second embodiment is provided two side by side, and the first input terminals 24, the second input terminals 26, the third input terminals 52, and the fourth input terminals 54 of the two high frequency switches 40 are respectively connected to one another.

When the two high frequency switches 40 are used, the poles 12a of the SPDTs(A) 12, the poles 14a of the SPDTs (B) 14, the poles 42a of the SPDTs(F) 42 and the poles 44a of the SPDTs(G) 44 are respectively connected to one another, and the number of input terminals is set to four and the number of output terminals is set to two.

The 4×2 matrix switch 56 makes use of the high frequency switches 40. Therefore, the number of control terminals can be reduced even in the 4×2 matrix switch 56.

When the state of FIG. 11 is switched to a state shown in FIG. 12, a branched one of a signal of In1 is connected to a 50 Ω circuit but another branch is brought to an open state. With this view, the signal to an Out1 is expected to greatly vary during a period in which its amplitude and phase change from the state of FIG. 11 to the state of FIG. 12.

Since, however, the 4×2 matrix switch 56 shown in FIG. 11 is configured by providing the high frequency switches 40 side by side, the poles 12a of the SPDTs(A) 12, the poles 14a of the SPDTs(B) 14, the poles 42a of the SPDT(F) 42 and the poles 44a of the SPDTs(G) 44 are respectively connected to one another. The terminating resistors 12d, 14d, 42d and 44d are respectively connected to the second port 12c of the SPDT(A) 12, the second port 14c of the SPDT(B) 14, the second port 42c of the SPDT(F) 42 and the second port 44c of the SPDT(G) 44. Thus, even when a specific circuit is changed from an ON state to an OFF state, the impedances from the ON state to the OFF state become equal, and the amplitude and phase of a signal on other path are controlled so as to vary small.

Incidentally, the third embodiment has explained the example in which the high frequency switch 10 according to the first embodiment is provided two side by side, the first input terminals 24, the second input terminals 26 and the third input terminals 28 of the two high frequency switches 10 are respectively connected to one another, thereby configuring the 3×2 matrix switch 54, and the example in which the high frequency switch 40 according to the second embodiment is provided two side by side, and the first input terminals 24, the second input terminals 26, the third input terminals 52 and the fourth input terminals 54 of the two high frequency switches 40 are respectively connected to one another, thereby configuring the 4×2 matrix switch 56. It is however possible to configure a 3×n matrix switch by providing the n high frequency switches 10 side by side or configure a 4×n matrix switch by providing the n high frequency switches 40 side by side.

Incidentally, although the first embodiment has explained the SP3D type high frequency switch 10 and the second embodiment has explained the SP4D type high frequency switch 40, SPDT type high frequency switches 18 and 48 are used as elements constituting the high frequency switch 10 and the high frequency switch 40.

Even in the case of the high frequency switches 18 and 48, the terminating resistors 12d, 14d, 42d and 44d are respectively connected to the second port 12c of the SPDT(A) 12, the second port 14c of the SPDT(B) 14, the second port 42c of the SPDT(F) 42 and the second port 44c of the SPDT(G) 44.

Thus, it is needless to say that these high frequency switches 18 and 48 also have advantageous effects that the number of control pins is reduced to enable a size reduction, an isolation characteristic is enhanced owing to such a simple configuration that the second ports of SPDTs are connected to their corresponding terminating resistors, and a reflection variation in input signal, i.e., variations in the intensity and phase of the input signal can be lessened owing to the effects of the terminating resistors upon input changeover to the first and second SPDT switches, thereby making it possible to suppress adverse effects exerted on other circuits.

As described above, a high frequency switch device according to the present invention is effective as a high frequency switch device employed in a wireless communication apparatus and a satellite communication apparatus. In a cellular phone and a satellite communication apparatus in particular, the present high frequency switch device is suitable for use as a high frequency switch device low in cost and good in S/N ratio.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A high frequency switch structure comprising first, second, third, and fourth input terminals and first and second high frequency switch devices, wherein
the first high-frequency switch device includes
first, second, third, fourth, fifth, sixth, and seventh single pole-double throw-switches, each of the first, second, third, fourth, fifth, sixth, and seventh SPDT switches having one pole, a first port, and a second port, wherein
the second ports of the first second, fourth, and fifth SPDT switches are respectively grounded via respective first, second, third, and fourth terminating resistors, each terminating resistor having predetermined impedance,
the first port of the third SPDT switch is connected to the first port of the first SPDT switch, the second port of the third SPDT switch is connected to the first port of the second SPDT switch,
the first port of the sixth SPDT switch is connected to the first port of the fourth SPDT switch,
the second port of the sixth SPDT switch is connected to the first port of the fifth SPDT switch,
the first port of the seventh SPDT switch is directly connected to the pole of the third SPDT switch, and
the second port of the seventh SPDT switch is directly connected to the pole of the sixth SPDT switch;
the second high-frequency switch device includes
eighth, ninth, tenth, eleventh, twelfth, thirteenth, and fourteenth single pole-double throw switches, each of the eighth, ninth, tenth, eleventh, twelfth, thirteenth, and fourteenth SPDT switches having one pole, a first port, and a second port, wherein
the second ports of the eighth, ninth, eleventh, and twelfth SPDT switches are respectively grounded via respective fifth, sixth, seventh, and eighth terminating resistors, each terminating resistor having predetermined impedance,
the first port of the tenth SPDT switch is connected to the first port of the eighth SPDT switch,
the second port of the tenth SPDT switch is connected to the first port of the ninth SPDT switch,
the first port of the thirteenth SPDT switch is connected to the first port of the eleventh SPDT switch,
the second port of the thirteenth SPDT switch is connected to the first port of the twelfth SPDT switch,
the first port of the fourteenth SPDT switch is directly connected to the pole of the tenth SPDT switch, and
the second port of the fourteenth SPDT switch is directly connected to the pole of the thirteenth SPDT switch;
the poles of the first and eighth SPDT switches are directly connected to the first input terminal;
the poles of the second and ninth SPDT switches are directly connected to the second input terminal;
the poles of the fourth and eleventh SPDT switches are directly connected to the third input terminal; and
the poles of the fifth and twelfth SPDT are directly connected to the fourth input terminal.

2. A high frequency switch device comprising:
first, second, third, fourth, and fifth single pole-double throw (SPDT) switches, each of the first, second, third, fourth, and fifth SPDT switches having one pole, a first port, and a second port, wherein
the second ports of the first, second, and fourth SPDT switches are respectively grounded via respective first, second, and third terminating resistors, each terminating resistor having predetermined impedance,
the first port of the third SPDT switch is connected to the first port of the first SPDT switch,
the second port of the third SPDT switch is connected to the first port of the second SPDT switch,
the first port of the fifth SPDT switch is directly connected to the pole of the third SPDT switch, and
the second port of the fifth SPDT switch is directly connected to the first port of the fourth SPDT switch.

3. The high frequency switch device according to claim 2, wherein
the first and second SPDT switches include first, second, third, and fourth field effect transistors, respectively, and respectively have configurations wherein
the first and second field effect transistors are connected in series via their sources and drains and the first and second field effect transistors connected in series include first ends corresponding to the poles of the first and second SPDT switches, and second ends corresponding to the first ports of the first and second SPDT switches, and
the third and fourth field effect transistors are connected in parallel to one another via their sources and drains and shunt-connected to the first ends of the first and second field effect transistors connected in series and to ground terminals via the first and second terminating resistors;
the third and fifth SPDT switches respectively include fifth, sixth, seventh, and eighth field effect transistors and each of the third and fifth SPDT switches has a configuration wherein
one of a source or drain of the fifth field effect transistor is the first port of the third and fifth SPDT switches, and the sixth field effect transistor is shunt-connected between the first port of the third and fifth SPDT switches and a ground terminal via a source and drain of the sixth field effect transistor, and
a source or drain of the seventh field effect transistor is the second port of the third and fifth SPDT switches, and the eighth field effect transistor is shunt-connected between the second port of the of the third and fifth SPDT switches and the ground terminal via a source and drain of the eighth field effect transistor, and the sources or drains of the fifth and seventh field effect transistors are the pole of the third and fifth SPDT switches; and
the fourth SPDT switch includes ninth and tenth field effect transistors and has a configuration wherein
one of a source or drain of the ninth field effect transistor is the pole of the fourth SPDT switch and the other of the source and drain is the first port of the fourth SPDT switch, and
the tenth field effect transistor is shunt-connected to the pole of the fourth SPDT switch via a source or drain of the tenth field effect transistor and connected to the ground terminal via the third terminating resistor.

4. The high frequency switch device according to claim 2, wherein
when
logic for causing the pole to be connected to the first port is 1 and logic for causing the pole to be connected to the second port is 0 in the first SPDT switch,
logic for causing the pole to be connected to the first port is 1 and logic for causing the pole to be connected to the second port is 0 in the second SPDT switch,
logic for causing the pole to be connected to the first port connected to the pole of the first SPDT switch is 1 and logic for causing the pole to be connected to the second port connected to the pole of the second SPDT switch is 0 in the third SPDT switch,
logic for causing the pole to be connected to the first port is 1 and logic for causing the pole to be connected to the second port is 0 in the fourth SPDT switch,
logic for causing the pole to be connected to the first port connected to the pole of the third SPDT switch is 1 and logic for causing the pole to be connected to the second port connected to the pole of the fourth SPDT switch is 0 in the fifth SPDT switch, and logic operations of the first, second, third, fourth, and fifth SPDT switches are respectively set as SPDT1, SPDT2, SPDT3, SPDT4, and SPDT5, the logic operations are defined as:

SPDT1=SPDT5∩SPDT3

SPDT2=SPDT5∩$\overline{SPDT3}$

SPDT4=$\overline{SPDT5}$.

5. The high frequency switch device according to claim 3, wherein when logic for causing the pole to be connected to the first port is 1 and logic for causing the pole to be connected to the second port is 0 in the first SPDT switch, logic for causing the pole to be connected to the first port is 1 and logic for causing the pole to be connected to the second port is 0 in the second SPDT switch, logic for causing the pole to be connected to the first port connected to the pole of the first SPDT switch is 1 and logic for causing the pole to be connected to the second port connected to the pole of the second SPDT switch is 0 in the third SPDT switch, logic for causing the pole to be connected to the first port is 1 and logic for causing the pole to be connected to the second port is 0 in the fourth SPDT switch, logic for causing the pole to be connected to the first port connected to the pole of the third SPDT switch is 1 and logic for causing the pole to be connected to the second port connected to the pole of the fourth SPDT switch is 0 in the fifth SPDT switch, and logic operations of the first, second, third, fourth, and fifth SPDT switches are respectively set as SPDT1, SPDT2, SPDT3, SPDT4, and SPDT5, the logic operations are defined as:

SPDT1=SPDT5∩SPDT3

SPDT2=SPDT5∩$\overline{SPDT3}$

SPDT4=$\overline{SPDT5}$.

6. A high frequency switch structure comprising first and second high frequency switch devices, wherein the first high-frequency switch device includes first, second, third, fourth, and fifth single pole-double throw (SPDT) switches, each of the first, second, third, fourth, and fifth SPDT switches having one pole, a first port, and a second port, wherein the second ports of the first, second, and fourth SPDT switches are respectively grounded via respective first, second, and third terminating resistors, each terminating resistor having predetermined impedance, the first port of the third SPDT switch is connected to the first port of the first SPDT switch, the second port of the third SPDT switch is connected to the first port of the second SPDT switch, the first port of the fifth SPDT switch is directly connected to the pole of the third SPDT switch, and the second port of the fifth SPDT switch is directly connected to the first port of the fourth SPDT switch;

the second high-frequency switch device includes sixth, seventh, eighth, ninth, and tenth single pole-double throw switches, each of the sixth, seventh, eighth, ninth, and tenth SPDT switches having one pole, a first port, and a second port, the second ports of the sixth, seventh, and ninth SPDT switches are respectively grounded via respective fourth, fifth, and sixth terminating resistors, each terminating resistor having predetermined impedance, the first port of the eighth SPDT switch is connected to the first port of the sixth SPDT switch, the second pod of the eighth SPDT switch is connected to the first port of the seventh SPDT switch, the first port of the tenth SPDT switch is directly connected to the pole of the eighth SPDT switch, and the second port of the tenth SPDT switch is directly connected to the first port of the ninth SPDT switch;

the poles of the first and sixth SPDT switches are directly connected to each other;

the poles of the second and seventh SPDT switches are directly connected to each other; and the poles of the fourth and ninth SPDT switches are directly connected to each other.

* * * * *